United States Patent
Hwang et al.

(10) Patent No.: US 10,193,055 B2
(45) Date of Patent: Jan. 29, 2019

(54) PRINTED CIRCUIT BOARD AND METHOD OF MANUFACTURING THE SAME

(71) Applicant: Samsung Electro-Mechanics Co., Ltd., Suwon-si (KR)

(72) Inventors: Mi Ran Hwang, Suwon-si (KR); Se Jong Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 546 days.

(21) Appl. No.: 14/954,284

(22) Filed: Nov. 30, 2015

(65) Prior Publication Data

US 2016/0156333 A1    Jun. 2, 2016

(30) Foreign Application Priority Data

Dec. 2, 2014    (KR) .................. 10-2014-0170583

(51) Int. Cl.
| | |
|---|---|
| H03H 9/25 | (2006.01) |
| H01L 41/31 | (2013.01) |
| H05K 1/02 | (2006.01) |
| H05K 1/16 | (2006.01) |
| H03H 9/10 | (2006.01) |
| H05K 3/46 | (2006.01) |

(52) U.S. Cl.
CPC ............. *H01L 41/31* (2013.01); *H05K 1/023* (2013.01); *H05K 1/16* (2013.01); *H05K 3/4697* (2013.01); *H03H 9/1064* (2013.01); *H05K 3/4602* (2013.01); *H05K 2201/0187* (2013.01)

(58) Field of Classification Search
CPC .......... H01L 41/31; H05K 1/023; H05K 1/16; H05K 3/4697; H03H 9/25
USPC ...... 310/313 A–313 D, 313 R; 333/193–196; 29/25.35
See application file for complete search history.

(56) References Cited

U.S. PATENT DOCUMENTS

| | | | | |
|---|---|---|---|---|
| 2001/0011857 | A1* | 8/2001 | Morishima | ............ H03H 9/059 310/313 R |
| 2007/0089525 | A1* | 4/2007 | Momose | ............. B60C 23/0408 73/753 |
| 2013/0214877 | A1* | 8/2013 | Adkisson | ............ G06F 17/5063 333/187 |

FOREIGN PATENT DOCUMENTS

| | | | | |
|---|---|---|---|---|
| JP | 2014-014131 A | | 1/2014 | |
| JP | 2014057124 A | * | 3/2014 | ............... H03H 9/25 |
| JP | 2016208367 A | * | 12/2016 | ............... H03H 9/25 |
| KR | 10-2014-0112158 A | | 9/2014 | |

* cited by examiner

*Primary Examiner* — Thomas Dougherty
(74) *Attorney, Agent, or Firm* — NSIP Law

(57) ABSTRACT

A printed circuit board includes: insulating layers and wiring layers arranged in stacked configuration; a cavity disposed in a first insulating layer among the insulating layers; a piezoelectric substrate disposed in the cavity; an electrode disposed on the piezoelectric substrate and configured to convert an electrical signal into an elastic wave or to convert an elastic wave into an electrical signal; and a sealing part disposed on the piezoelectric substrate, the sealing part enclosing the electrode and forming an air gap around the electrode.

17 Claims, 6 Drawing Sheets

PRINTED CIRCUIT BOARD AND METHOD OF MANUFACTURING THE SAME

CROSS-REFERENCE TO RELATED APPLICATION(S)

This application claims the benefit of Korean Patent Application No. 10-2014-0170583 filed on Dec. 2, 2014 in the Korean Intellectual Property Office, the entire disclosure of which is incorporated herein by reference for all purposes.

BACKGROUND

1. Field

The following description relates to a printed circuit board and a method of manufacturing the same.

2. Description of Related Art

An elastic wave element, such as a surface acoustic wave (SAW) filter, is used as a band pass filter in electronic devices such as mobile phones. The SAW filter is an electronic element allowing signals having a desired frequency to pass therethrough and removing portions of the signals having an unnecessary frequency.

In accordance with the gradual miniaturization of electronic devices, a printed circuit board having a decreased mounting area for electronic elements, such as elastic wave elements, has been in demand.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

According to one general aspect, a printed circuit board includes: insulating layers and wiring layers arranged in stacked configuration; a cavity disposed in a first insulating layer among the insulating layers; a piezoelectric substrate disposed in the cavity; an electrode disposed on the piezoelectric substrate and configured to convert an electrical signal into an elastic wave or to convert an elastic wave into an electrical signal; and a sealing part disposed on the piezoelectric substrate, the sealing part enclosing the electrode and forming an air gap around the electrode.

The printed circuit board may further include a via extending through at least one of the insulating layers and electrically connecting the electrode and the wiring layers to each other.

The sealing part may include a non-conductive material.

The air gap may be filled with an electrode corrosion inhibitor.

The electrode may include an interdigital transducer (IDT).

The first insulating layer may be a core layer among the insulating layers.

According to another general aspect, a printed circuit board includes: a core layer including a cavity; an elastic wave element disposed in the cavity; insulating layers disposed above and below the core layer; and wiring layers disposed on the insulating layers. The elastic wave element includes a piezoelectric substrate, an IDT disposed on the piezoelectric substrate, and a sealing part disposed on the piezoelectric substrate, the sealing part enclosing the IDT and creating an air gap around the IDT.

The printed circuit board may further include a via penetrating through at least one of the insulating layers and electrically connecting the IDT and the wiring layers to each other.

The sealing part may include a non-conductive material.

The air gap may be filled with an electrode corrosion inhibitor.

According to another general aspect, a method of manufacturing a printed circuit board includes: forming a cavity in a core layer; forming a piezoelectric substrate in the cavity; forming an electrode on the piezoelectric substrate, the electrode being configured to convert an electrical signal into an elastic wave or an elastic wave into an electrical signal; forming a sealing part on the piezoelectric substrate to enclose the electrode and form an air gap around the electrode; forming insulating layers above and below the core layer; and forming wiring layers on the insulating layers.

The method may further include forming a via electrically connecting the electrode and the wiring layers to each other.

The electrode may include an IDT.

The sealing part may include a non-conductive material.

The method may further include adjusting a thickness of the piezoelectric substrate or a thickness of the sealing part to control a size of the air gap.

The method may further include filling the air gap with an electrode corrosion inhibitor.

The forming of the piezoelectric substrate may include injecting a piezoelectric material into the cavity and hardening the piezoelectric material.

The forming of the cavity may include forming the cavity using a laser beam, a punch, or a blade.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Printed Circuit Board

Figure 1:
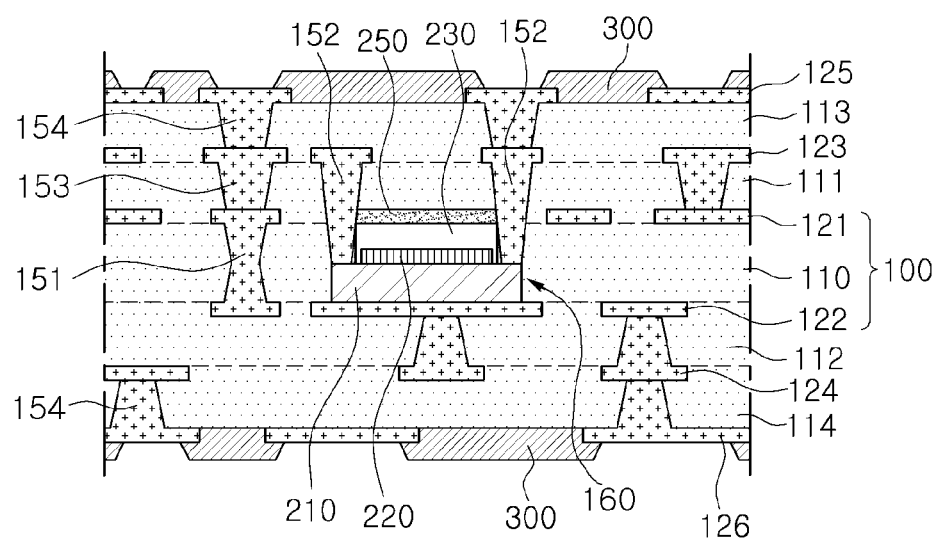
FIG. 1 is a cross-sectional view illustrating a structure of a printed circuit board according to an example.

FIG. 1 is a cross-sectional view illustrating a structure of a printed circuit board 1000 according to an example.

Referring to FIG. 1, the printed circuit board 1000 includes a core layer 100 in which a cavity 160 is formed, a piezoelectric substrate 210 disposed in the cavity 160, an electrode 220 disposed on the piezoelectric substrate 210 and configured to convert an electrical signal into an elastic wave, or to convert an elastic wave into an electrical signal, and a sealing part 250 disposed on the piezoelectric substrate 210 and enclosing the electrode 220 to form an air gap 230 around the electrode 220.

The printed circuit board 1000 includes an elastic wave element having the electrode 220 formed on the piezoelectric substrate 210 in the cavity 160 in the core layer 100, whereby a mounting area of the elastic wave element may be decreased and utilization of space of the printed circuit board 1000 may be increased. In addition, an open defect due to a crack, or the like, in a bump ball, occurring when the elastic wave element is mounted on a surface of the printed circuit board, may be prevented, and a defect occurring due to permeation of external moisture into the elastic wave element may be prevented.

The core layer 100 includes first wiring layers 121 and 122 formed on upper and lower surfaces of an insulating layer 110, respectively. The first wiring layers 121 and 122 are electrically connected to each other by vias 151 penetrating through the insulating layer 110.

The core layer 100 includes the cavity 160 in which the elastic wave element is accommodated. The cavity 160 may be formed, for example, using a punch or a blade.

The elastic wave element includes the piezoelectric substrate 210, the electrode 220, the sealing part 250 and the air gap 230. According to an example, instead of separately manufacturing the elastic wave element and embedding the elastic wave element in the printed circuit board 1000, the elastic wave element may be provided in the cavity 160 by forming the piezoelectric substrate 210 in the cavity, forming the electrode 220 on the piezoelectric substrate 210, and then forming the sealing part 250.

In the example embodiment, since the elastic wave element is formed by forming the cavity 160 in the core layer 100, injecting a piezoelectric material into the cavity 160, and hardening the piezoelectric material to form the piezoelectric substrate 210, the size and shape of the elastic wave element may be variously modified.

The piezoelectric substrate 210 may contain, for example, lithium tantalate (LiTaO$_3$) or lithium niobate (LiNbO$_3$). However, a material of the piezoelectric substrate 210 is not necessarily limited the aforementioned materials, and may be any material suitable for use as a piezoelectric material of the elastic wave element.

The electrode 220 may include an interdigital transducer (IDT). The electrode 220 may contain any conductive material, for example, copper (Cu), aluminum (Al), or the like, that may serve to convert an electrical signal into an elastic wave, or to convert an elastic wave into an electrical signal.

The sealing part 250 forms the air gap 230 in order to secure a space in which the electrode 220 may vibrate. The electrode 220 is sealed by the sealing part 250 formed on the piezoelectric substrate 210. The permeation of moisture, or the like, may be prevented by the sealing part 250. The sealing part 250 contains a non-conductive material, for example, a thermosetting resin.

The air gap 230 may be a void filled with air. However, in another example, the air gap 230 may be filled with an electrode corrosion inhibitor. The electrode corrosion inhibitor may contain any material, for example, nitrogen gas, that inhibits corrosion of the electrode due to contact with air or moisture having permeated into the air gap 230.

Insulating layers 111 and 112 are disposed above and below the core layer 100, respectively, and second wiring layers 123 and 124 are disposed on surfaces of the insulating layers 111 and 112, respectively.

The first wiring layers 121 and 122 and the second wiring layers 123 and 124 are electrically connected to each other by vias 153 penetrating through the insulating layers 111 and 112.

The electrode 220 and the second wiring layer 123 are electrically connected to each other by vias 152 penetrating through the insulating layer 111 and extended into the core layer 100. The vias 152 and the electrode 220 are electrically connected to each other by wirings (not illustrated) formed on the piezoelectric substrate 210.

Resin insulators may be used as the insulating layers 110, 111, and 112. The material of the resin insulating layer may include a thermosetting resin such as an epoxy resin, a thermoplastic resin such as polyimide, or a resin having a reinforcing material such as a glass fiber or an inorganic filler impregnated in the thermosetting resin or the thermoplastic resin, for example, a prepreg. However, the material of the resin insulating layer is not specifically limited to the foregoing examples.

The wiring layers 121, 122, 123, and 124 and the vias 151, 152, and 153 may be formed of any material, for example, copper (Cu), that is commonly used as a conductive metal for a printed circuit board.

In addition, insulating layers 113 and 114 are disposed on the second wiring layers 123 and 124, respectively, and third wiring layers 125 and 126 are further disposed on surfaces of the insulating layers 113 and 114, respectively.

The second wiring layers 123 and 124 and the third wiring layers 125 and 126 are electrically connected to each other by vias 154 penetrating through the insulating layers 113 and 114.

Although a case in which the first to third wiring layers 121 to 126 are formed is illustrated in FIG. 1, the number of wiring layers is not necessarily limited to the number of wiring layers shown, but may be adjusted to be within a range that may be utilized by those skilled in the art.

Solder resists 300 are disposed on surfaces of the printed circuit board to expose wiring patterns for external connection pads in the outermost wiring layers 125 and 126.

In addition, electronic elements (not illustrated) for surface mounting such as an inductor, a capacitor, a high frequency integrated circuit (IC), and the like, may be mounted on the wiring patterns for external connection pads on the surfaces of the printed circuit board 1000.

Method of Manufacturing Printed Circuit Board

FIGS. 2A through 8 are views sequentially illustrating a method of manufacturing the printed circuit board 1000 according to an example.

Figure 2A:
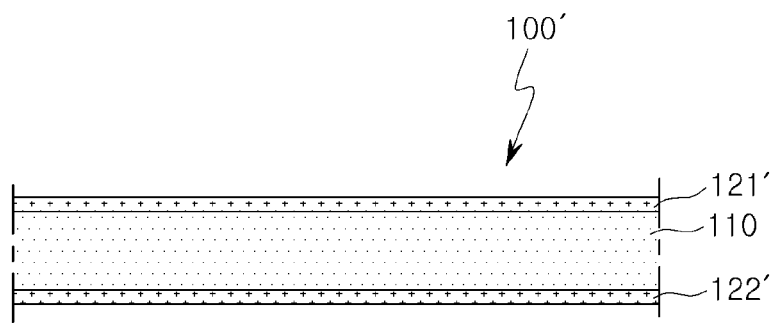
FIGS. 2A through 8 are views sequentially illustrating a method of manufacturing the printed circuit board, according to an example.

Referring to FIG. 2A, a laminate 100' in which metal plates 121' and 122' are formed on upper and lower surfaces of the insulating layer 110, respectively, is prepared. A resin insulating layer may be used as the insulating layer. More specifically, a thermosetting resin such as an epoxy resin, a thermoplastic resin such as polyimide, or a resin having a reinforcing material such as a glass fiber or an inorganic filler impregnated in the thermosetting resin or the thermoplastic resin, for example, a prepreg (PPG), may be used.

However, the material of the resin insulating layer is not specifically limited to the foregoing examples. The metal plates 121' and 122' may be formed of a copper (Cu) foil, but are not necessarily limited thereto.

Figure 2B:
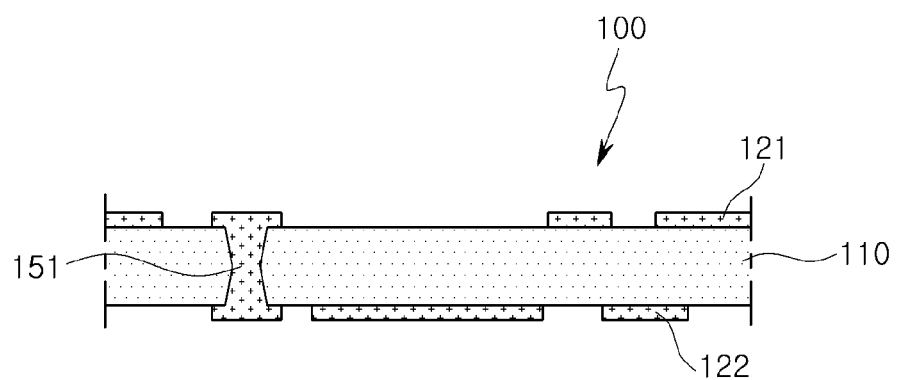

Referring to FIG. 2B, the first wiring layers 121 and 122 are formed on the insulating layer 110, and the vias 151 connecting the first wiring layers 121 and 122 to each other are formed in the insulating layer 110 to form the core layer 100. The first wiring layers 121 and 122 are formed by selectively forming etching resists on the metal plates 121' and 122' of the laminate 100' in a photolithograph scheme, and applying an etchant to regions of the metal plates 121' and 122' on which the etching resists are not formed to selectively remove portions of the metal plates 121' and 122'.

The vias 151 for electrically connecting the first wiring layers 121 and 122, formed on the upper and lower surfaces of the insulating layer 110, are formed by forming via holes in the insulating layer 110 and plating the via holes.

Figure 3A:
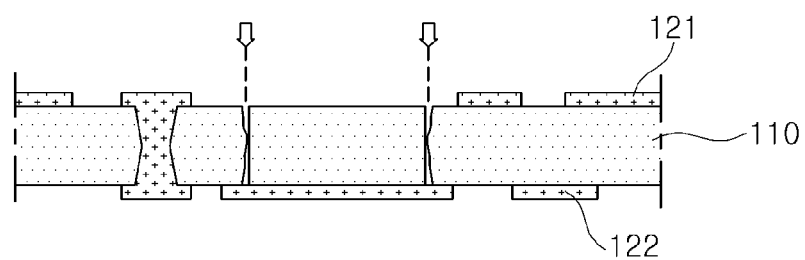
Figure 3B:
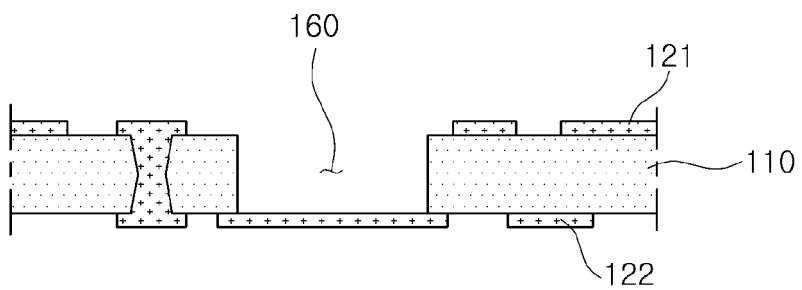

Referring to FIGS. 3A and 3B, the cavity 160 is formed by removing a portion of the insulating layer 110 of the core layer 100. The cavity 160 may be formed, for example, using a laser beam, a punch, or a blade.

Figure 4:
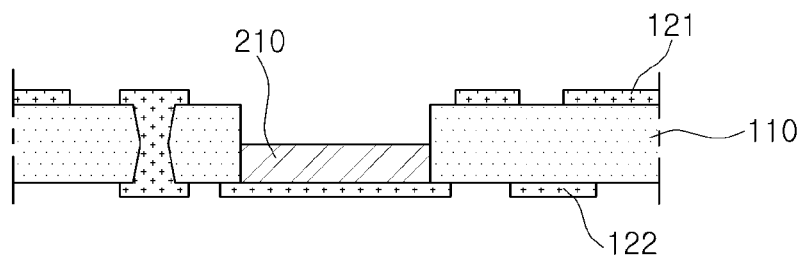

Referring to FIG. 4, the piezoelectric substrate 210 is formed in the cavity 160. The piezoelectric substrate 210 is formed by injecting a piezoelectric material such as lithium tantalate ($LiTaO_3$), lithium niobate ($LiNbO_3$), or the like, into the cavity 160 and hardening the piezoelectric material.

As described above, in the printed circuit board 1000, since the elastic wave element is provided in a scheme of forming the cavity 160 in the core layer 100, injecting the piezoelectric material into the cavity 160, and hardening the piezoelectric material to form the piezoelectric substrate 210, a size and a shape of the elastic wave element may be variously implemented.

Figure 5:
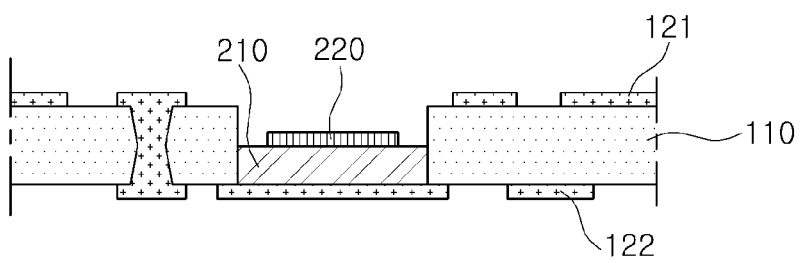

Referring to FIG. 5, the electrode 220 is formed on the piezoelectric substrate 210. The electrode 220 may include the interdigital transducer (IDT). The electrode 220 may contain any conductive material, for example, copper (Cu), aluminum (Al), or the like, that may serve to convert an electrical signal into an elastic wave or to convert an elastic wave into an electrical signal.

Figure 6:
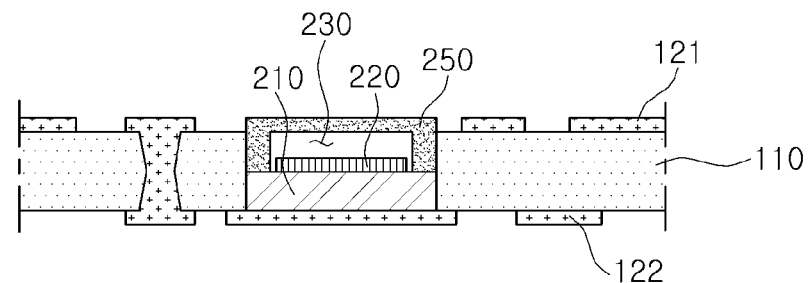

Referring to FIG. 6, the sealing part 250 is formed on the piezoelectric substrate 210 to enclose the electrode 220 with the air gap 230 formed around the electrode 220. The sealing part 250 includes the air gap 230 in order to secure the space in which the electrode 220 may vibrate. The electrode 220 is sealed by the sealing part 250 formed on the piezoelectric substrate 210. Permeation of moisture, or the like, may be prevented by the sealing part 250. The sealing part 250 contains a non-conductive material, for example, a thermosetting resin.

A thickness of the piezoelectric substrate 210 or a thickness of the sealing part 250 may be adjusted to control a size of the air gap 230. The air gap 230 may be a void filled with air. However, in another example, the electrode corrosion inhibitor may be provided in the air gap 230. The electrode corrosion inhibitor may include any material that inhibits corrosion of the electrode resulting from the contact with air or moisture having permeated into the air gap 230. For example, the electrode corrosion inhibitor may include nitrogen gas.

According to the example embodiment disclosed herein, instead of separately manufacturing the elastic wave element and embedding the elastic wave element in the printed circuit board, the elastic wave element is provided in the cavity 160 of the core layer 100 by forming the piezoelectric substrate 210 in the cavity 160, forming the electrode 220 on the piezoelectric substrate 210, and then forming the sealing part 250, in the process of manufacturing the printed circuit board 1000.

The printed circuit board 1000 includes the elastic wave element in the cavity 160 of the core layer 100, whereby a mounting area of the elastic wave element may be decreased and utilization of space of the printed circuit board may be increased. In addition, an open defect due to a crack, or the like, of a bump ball occurring when the elastic wave element is mounted on a surface of the printed circuit board may be prevented, and a defect occurring due to permeation of external moisture into the elastic wave element may be prevented.

Figure 7:
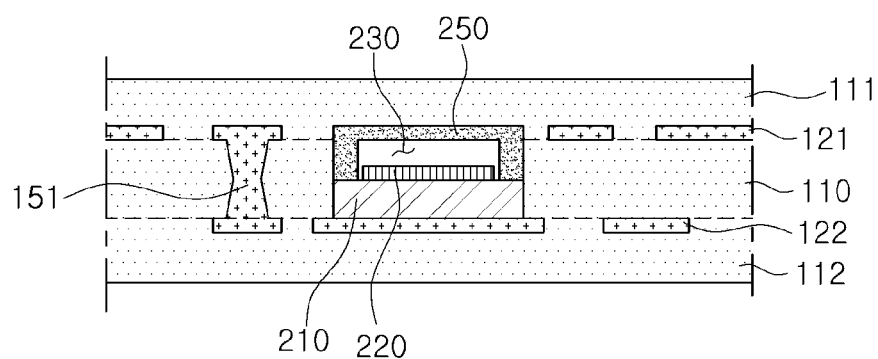

Referring to FIG. 7, the insulating layers 111 and 112 are formed above and below the core layer 100, respectively. The insulating layers 111 and 112 are formed by stacking resin layers above and below the core layer 100 and applying heat and pressure to the resin layers.

Resin insulating layers may be used as the insulating layers 111 and 112. A thermosetting resin such as an epoxy resin, a thermoplastic resin such as polyimide, or a resin having a reinforcing material such as a glass fiber or an inorganic filler impregnated in the thermosetting resin or the thermoplastic resin, for example, a prepreg, may be used. However, the material of the resin insulating layer is not specifically limited to the foregoing materials.

Figure 8:
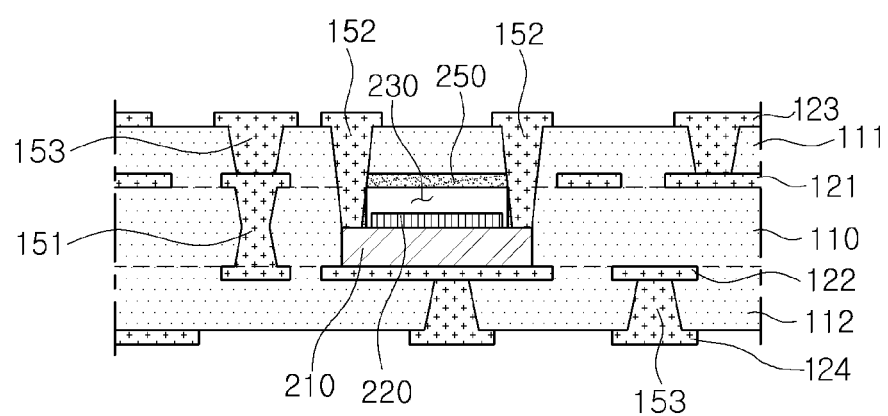

Referring to FIG. 8, the vias 153 penetrating through the insulating layers 111 and 112 are formed in the insulating layers 111 and 112 and the second wiring layers 123 and 124 are formed on the surfaces of the insulating layers 111 and 112, respectively. The vias 153 are formed by forming via holes (not illustrated) in the insulating layers 111 and 112 and filling the via holes (not illustrated) with a conductive material through plating.

The via holes (not illustrated) may be formed using a mechanical drill or a laser drill, but are not necessarily limited thereto. The laser drill may be a $CO_2$ laser drill or a YAG laser drill, but is not necessarily limited thereto.

The second wiring layers 123 and 124 are formed by forming resists (not illustrated) patterned to thereby have opening parts in the insulating layers 111 and 112 and filling the opening parts with a conductive metal through electroless plating, electroplating, or the like.

In addition, the vias 152 electrically connecting the electrode 220 of the elastic wave element and the second wiring layer 123 are formed. The vias 152 penetrate through the insulating layer 111 and extend into the core layer 100. The vias 152 and the electrode 220 are electrically connected to each other by wirings (not illustrated) formed on the piezoelectric substrate 210.

Next, referring back to FIG. 1, the insulating layers 113 and 114 are formed on the second wiring layers 123 and 124, respectively. The vias 154, which are similar to the vias 153, are formed in the insulating layers 113 and 114 and the third wiring layers 125 and 126, which are similar to the second wiring layers 123 and 124, are formed to provide additional build-up layers. Further build-up layers including further insulating layers, vias and wiring layers may be formed in a similar manner. The build-up layers may be formed in a number that may be utilized by those skilled in the art.

As set forth above, according to example embodiments disclosed herein, the mounting area of the elastic wave element may be decreased and the utilization of the space of the printed circuit board may be increased.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A printed circuit board comprising:
a first insulating layer;
a first wiring layer disposed on an upper surface of the first insulating layer;
a second insulating layer disposed above the first insulating layer, and on the first wiring layer;
a second wiring layer disposed on an upper surface of the second insulating layer;
a cavity disposed in the first insulating layer;
a piezoelectric substrate disposed in the cavity;
an electrode disposed on the piezoelectric substrate and configured to convert an electrical signal into an elastic wave or to convert an elastic wave into an electrical signal;
a first via extending through the second insulating layer and into the first insulating layer, and electrically connecting the electrode to the second wiring layer;
a second via extending through the second insulating layer and electrically connecting the first wiring layer to the second wiring layer; and
a sealing part disposed on the piezoelectric substrate, the sealing part enclosing the electrode and forming an air gap around the electrode.

2. The printed circuit board of claim 1, wherein the sealing part comprises a non-conductive material.

3. The printed circuit board of claim 1, wherein the air gap is filled with an electrode corrosion inhibitor.

4. The printed circuit board of claim 1, wherein the electrode includes an interdigital transducer (IDT).

5. The printed circuit board of claim 1, wherein the first insulating layer is a core layer.

6. A printed circuit board comprising:
a core layer comprising a cavity;
an elastic wave element disposed in the cavity, and comprising:
a piezoelectric substrate;
an IDT disposed on the piezoelectric substrate, and
a sealing part disposed on the piezoelectric substrate, the sealing part enclosing the IDT and forming an air gap around the IDT;
a first wiring layer disposed on an upper surface of the core layer;
an insulating layer disposed above the core layer and on the first wiring layer;
a second wiring layer disposed on an upper surface of the second insulating layer;
a first via extending through the insulating layer and into the core layer, and electrically connecting the IDT to the second wiring layer; and
a second via penetrating through the insulating layer and electrically connecting the first wiring layer to the second wiring layer.

7. The printed circuit board of claim 6, wherein the sealing part comprises a non-conductive material.

8. The printed circuit board of claim 6, wherein the air gap is filled with an electrode corrosion inhibitor.

9. A method of manufacturing a printed circuit board, the method comprising:
forming a cavity in a core layer;
forming a piezoelectric substrate in the cavity;
forming an electrode on the piezoelectric substrate, the electrode being configured to convert an electrical signal into an elastic wave or an elastic wave into an electrical signal;
forming a sealing part on the piezoelectric substrate to enclose the electrode and form an air gap around the electrode;
forming a first wiring layer on an upper surface of the core layer;
forming an insulating layer above the core layer and on the first wiring layer;
forming a second wiring layer on an upper surface of the insulating layer;
forming a first via in the insulating layer and the core layer, the first via electrically connecting the electrode to the second wiring layer; and
forming a second via in the insulating layer, the second via electrically connecting the first wiring layer to the second wiring layer.

10. The method of claim 9, wherein the electrode comprises an IDT.

11. The method of claim 9, wherein the sealing part comprises a non-conductive material.

12. The method of claim 9, further comprising adjusting a thickness of the piezoelectric substrate or a thickness of the sealing part to control a size of the air gap.

13. The method of claim 9, further comprising filling the air gap with an electrode corrosion inhibitor.

14. The method of claim 9, wherein the forming of the piezoelectric substrate comprises injecting a piezoelectric material into the cavity and hardening the piezoelectric material.

15. The method of claim 9, wherein the forming of the cavity comprises forming the cavity using a laser beam, a punch, or a blade.

16. A method of manufacturing a printed circuit board, the method comprising:
forming a cavity in a core layer;
forming a piezoelectric substrate in the cavity by injecting a piezoelectric material into the cavity and hardening the piezoelectric material;
forming an electrode on the piezoelectric substrate, the electrode being configured to convert an electrical signal into an elastic wave or an elastic wave into an electrical signal;
forming a sealing part on the piezoelectric substrate to enclose the electrode and form an air gap around the electrode;
forming insulating layers above and below the core layer; and
forming wiring layers on the insulating layers.

17. A method of manufacturing a printed circuit board, the method comprising:
forming a cavity in a core layer using a laser beam, a punch, or a blade;
forming a piezoelectric substrate in the cavity;

forming an electrode on the piezoelectric substrate, the electrode being configured to convert an electrical signal into an elastic wave or an elastic wave into an electrical signal;

forming a sealing part on the piezoelectric substrate to enclose the electrode and form an air gap around the electrode;

forming insulating layers above and below the core layer; and forming wiring layers on the insulating layers.

* * * * *